(12) United States Patent
Aoki

(10) Patent No.: US 7,484,279 B2
(45) Date of Patent: Feb. 3, 2009

(54) METHOD OF FORMING A CONDUCTIVE THROUGH HOLE FOR A PIEZOELECTRIC SUBSTRATE

(75) Inventor: Shinya Aoki, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 69 days.

(21) Appl. No.: 11/470,543

(22) Filed: Sep. 6, 2006

(65) Prior Publication Data

US 2007/0058003 A1    Mar. 15, 2007

(30) Foreign Application Priority Data

Sep. 14, 2005    (JP)    ............... 2005-267455

(51) Int. Cl.
  *H01L 41/22*    (2006.01)
  *H01L 41/00*    (2006.01)
(52) U.S. Cl. .................. 29/25.35; 29/830; 29/831; 29/832; 29/852; 310/313 R
(58) Field of Classification Search ............... 29/25.35, 29/830, 832, 846, 835, 847, 831, 852; 310/313 R, 310/311, 313 A, 313 B; 333/141, 193; 438/105, 438/295

See application file for complete search history.

(56) References Cited

U.S. PATENT DOCUMENTS

| 3,887,887 | A | * | 6/1975 | Wagers et al. ............... 333/151 |
| 5,907,768 | A | * | 5/1999 | Malta et al. .................. 438/105 |
| 6,276,992 | B1 | * | 8/2001 | Houda et al. .................. 451/29 |
| 6,310,422 | B1 | * | 10/2001 | Satoh et al. ............. 310/313 R |
| 7,173,324 | B2 |  | 2/2007 | Lee et al. |
| 2007/0117245 | A1 |  | 5/2007 | Lee et al. |

FOREIGN PATENT DOCUMENTS

| JP | A 8-213874 | | 8/1996 |
| JP | 09162670 | * | 6/1997 |
| JP | A 2006-174311 | | 6/2006 |
| KR | 2005/0032158 A | | 4/2005 |

* cited by examiner

*Primary Examiner*—Peter Vo
*Assistant Examiner*—Tai Nguyen
(74) *Attorney, Agent, or Firm*—Oliff & Berridge, PLC

(57) ABSTRACT

In a method of forming a part of a through-hole for a piezoelectric substrate having an excitation electrode and a leading electrode which are formed on a first surface of the piezoelectric substrate and are made of a thin metal film in order to establish a conductivity, the method includes: blasting a position on a second surface of the piezoelectric substrate corresponding to the leading electrode to form a preliminary hole by boring the piezoelectric substrate in its halfway; etching a bottom of the preliminary hole to form a part of a through-hole through which a part of the leading electrode is exposed; and placing a conductive material in the part of a through-hole, the conductive material contacting the leading electrode from a side of the second surface of the piezoelectric substrate.

4 Claims, 6 Drawing Sheets

METHOD OF FORMING A CONDUCTIVE THROUGH HOLE FOR A PIEZOELECTRIC SUBSTRATE

BACKGROUND

1. Technical Field

The present invention relates to a part of a through-hole forming method for a piezoelectric substrate used in a piezoelectric device, and a method of manufacturing a piezoelectric device using the part of a through-hole forming method and a piezoelectric device manufactured thereby. More specifically, the invention relates to the piezoelectric substrate formed with an excitation electrode on a first surface, and the part of a through-hole forming method suitable for the piezoelectric device provided with the piezoelectric substrate and the piezoelectric device.

2. Related Art

The piezoelectric device used for an oscillator, a filter, a sensor or the like has been promoted to be compact and thin based on a downsizing of a device to which the piezoelectric device is mounted. The smallest piezoelectric device among what are currently under development is one having a, so-called chip size package (CSP) structure in which a package including a piezoelectric element is manufactured substantially the same size as the piezoelectric element. An example of the piezoelectric device of such structure is, among others, a surface acoustic wave (SAW) device. This example is described in JP-A-8-213874. The SAW device described in JP-A-8-213874 includes, as illustrated in FIG. 9, a piezoelectric substrate 2 formed with an excitation electrode 3 and leading electrodes 4 on a first surface thereof and a covering body 5 for covering the first surface of the piezoelectric substrate 2. More specifically, the covering body 5 is provided with a concave portion 6 at a position opposing to the excitation electrode 3 and part of a through-hole 7 at positions opposing to the leading electrodes 4, and the piezoelectric substrate 2 and the covering body 5 are bonded by means of anodic bonding. The through-hole 7 of the covering body 5 after bonding is filled with conductive material, and mountable exterior electrodes 8 are formed around the part of a through-hole 7. In the piezoelectric device 1 of such a structure, a mounting area of the element equals to that of the device, resulting in improvement of a downsizing of the piezoelectric device.

The piezoelectric device having the structure as stated in JP-A-8-213874 is considered as being suitable for downsizing and thinning of the piezoelectric device. However, the SAW device having the structure as stated in JP-A-8-213874 includes drawbacks as stated below.

First, since the piezoelectric substrate serving as the covering body is formed on one surface with the concave portion and the part of a through-hole, there is a high possibility for foreign matters to be attached to and remaining at the concave portion and the part of a through-hole while cleaning the substrate or the like. Second, the piezoelectric substrate and the covering body are bonded through a thin metal film formed around an edge portion of the piezoelectric substrate, such that there is a possibility that a gap may be created between each of the leading electrodes and each of the part of a through-hole. In this case, there arise possible troubles that conductivity between the external electrodes and the leading electrodes can not be established and an airtight sealing of an interior space may be degraded, thereby inviting a possibility of an undesirable invasion of gas or dust from the gap into the interior space.

SUMMARY

An advantage of some aspects of the invention is to resolve the above stated problems and thereby to provide a method of forming the part of a through-hole for piezoelectric substrate which enables to ensure a high airtight sealing to the excitation space and to establish conductivity between the exterior electrodes and the leading electrodes, respectively, within the excitation space with ease, and a method of manufacturing the piezoelectric device using the above method and the piezoelectric device manufactured thereby.

According to a first aspect of the invention, it relates to a method of forming a part of a through-hole for a piezoelectric substrate having an excitation electrode and a leading electrode, which are formed on a first surface of the piezoelectric substrate and are made of a thin metal film in order to establish a conductivity. The method includes: blasting a position on a second surface of the piezoelectric substrate corresponding to the leading electrode to form a preliminary hole by boring the piezoelectric substrate in its halfway; etching a bottom of the preliminary hole to form a part of a through-hole through which a part of the leading electrode is exposed; and placing a conductive material in the part of a through-hole, the conductive material contacting the leading electrode from a side of the second surface of the piezoelectric substrate.

This aspect of the invention prevents the conductive material from having inferior conductivity due to the gap possibly generated between the part of a through-hole and the leading electrode. Further, since preliminary holes are formed by means of abrasive blasting, even the piezoelectric substrate of a low etching rate can perform effective boring. Still further, since the preliminary holes are bored by means of etching, no destruction of the thin metal films due to blast particles will occur, which makes it possible to remain only the thin metal films as they are. Forming part of a through-hole with such a method will enable mounting of the piezoelectric substrate with a surface including the excitation electrodes facing up when mounting the piezoelectric substrate on a package or the like. As such, it becomes easy to adjust frequency after mounting the piezoelectric substrate. Yet further, when the leading electrodes are drawn to the other surface of the piezoelectric substrate, formation of electrodes on side surfaces of the piezoelectric substrate is not required any more. As such, a short-circuit between electrodes due to bad etching quality would be avoidable.

According to a second aspect of the invention, it relates to a method of manufacturing a piezoelectric device including the piezoelectric substrate formed on the first surface thereof with an excitation electrode and the leading electrodes and the covering body for covering an electrode forming surface of the piezoelectric substrate. The method includes: bonding the piezoelectric substrate with the covering body; blasting a position on a second surface of the piezoelectric substrate corresponding to the leading electrode to form a preliminary hole by boring the piezoelectric substrate in its halfway; etching a bottom of the preliminary hole to form a part of a through-hole through which a part of the leading electrode is exposed; and placing a conductive material in the part of a through-hole, the conductive material contacting the leading electrode from a side of the second surface of the piezoelectric substrate.

The above method can lower a possibility of destruction of the piezoelectric substrate and the covering body by being pressurized and heated upon bonding since boring of the piezoelectric substrate is performed after bonding the piezoelectric substrate with the covering body. Further, the part of a through-hole are thus formed on the piezoelectric substrate on which the excitation electrode and the leading electrodes are formed and the conductive members are thus disposes within the part of a through-hole in a manner direct to and continuously with the leading electrodes made of thin metal films, and therefore, there is only a little fear in occurring bad conductivity due to the gap created between the corresponding part of a through-hole and the leading electrodes. Still further, formation of the preliminary holes by means of abrasive blasting will enable the effective boring even with a piezoelectric substrate of a low etching rate. Still further, since the preliminary holes are bored by means of etching, no destruction of the thin metal films due to blast particles will occur and thus it becomes possible to remain only the thin metal films. Yet further, the part of a through-hole are formed on the piezoelectric substrate with the thin metal films being remained, the gap between the piezoelectric substrate and the covering body, namely, an excitation space, would not open to an ambient air and thus can keep a good airtightness.

Further, in the above stated piezoelectric device manufacturing method, it is effective for the leading electrodes to be subjected to a process of thickening the films. Such a process will reduce a possibility of damaging the thin metal films or the leading electrodes due to an adverse effect of an air pressure gap between the excitation space and the outside upon forming the part of a through-hole on the piezoelectric substrate.

Further, when performing the above stated piezoelectric device manufacturing method, it is desirable that the piezoelectric substrate is made of crystal, the thin metal films are made of aluminum and a dry etching using $CF_4$ gas as a reaction gas is employed among the etching processes. In the piezoelectric device manufactured under the aforementioned conditions, the piezoelectric substrate will be subjected to the dry etching to be etched, whereas the thin metal films would not be etched through the dry etching. Therefore, the part of a through-hole can be formed only in the piezoelectric substrate and the then metal films would not be damaged, resulting in being capable of keeping the airtightness of the excitation space in a good condition.

According to a third aspect of the invention, a piezoelectric device includes: a piezoelectric substrate; an excitation electrode and a leading electrode mounted on a first surface of the piezoelectric substrate and made of a thin metal film; a part of a through-hole and a mountable electrode mounted on a second surface of the piezoelectric substrate, the part of a through-hole formed from a portion corresponding to the leading electrode to the leading electrode; a conductive member formed in the part of a through-hole, and electrically connecting the leading electrode with the mountable electrode; and a covering body sealing an electrode forming surface of the piezoelectric substrate in an airtight manner.

The piezoelectric device having the above structure can realize a compact sized and a low profiled piezoelectric device, and to secure a high conductivity with the exterior mountable electrodes. Further, when the part of a through-hole are formed after bonding the piezoelectric substrate with the covering body, a high airtightness can be secured for the excitation space since the excitation space would not open to the outside.

It is desirable for the piezoelectric device having the above stated structure that the thin metal films composing the leading electrodes are made thicker than the thin metal film composing the excitation electrode. With such a structure, a possibility of the thin metal films being damaged upon forming the part of a through-hole on the piezoelectric substrate will be reduced.

According to a fourth aspect of the invention, the piezoelectric device is manufactured by any one of the above stated piezoelectric device manufacturing methods. Thus manufactured piezoelectric device can produce the advantageous effect as identified in the above stated piezoelectric device manufacturing methods.

According to a fifth aspect of the invention, the piezoelectric device may be provided with the piezoelectric element which is formed by the part of a through-hole forming method of the above stated piezoelectric substrate. Such piezoelectric device can produce the advantageous effect as identified in the above stated part of a through-hole forming method for piezoelectric substrate.

DESCRIPTION OF EXEMPLARY EMBODIMENTS

Explained hereinafter are embodiments of the through-hole forming method for piezoelectric substrate, and the piezoelectric device manufacturing method and the piezoelectric device of the invention, referring to the attached drawings. It should be appreciated that the embodiments as will be explained hereinafter are mere partial embodiments according to the invention and thus the invention will not be bound by the embodiments as explained hereinafter.

Figure 1A:
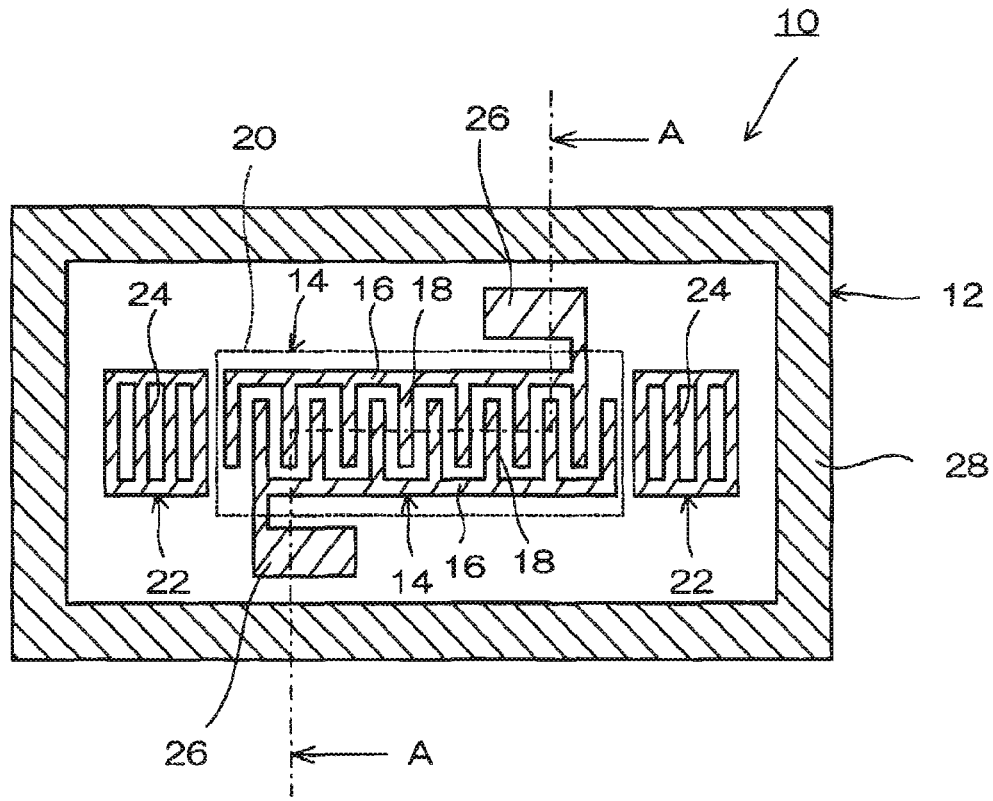
FIGS. 1A and 1B illustrate a first embodiment of a piezoelectric device according to the invention.
Figure 1B:
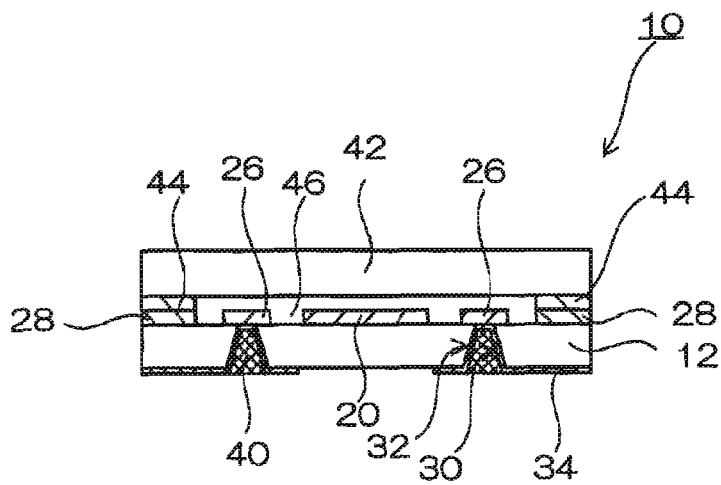
Figure 2A:
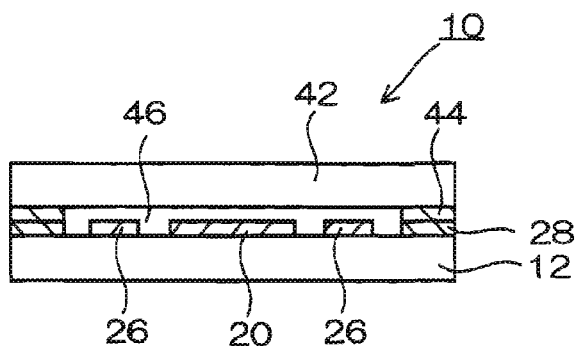
FIGS. 2A through 2E schematically illustrate manufacturing steps of the piezoelectric device of the first embodiment according to the invention.
Figure 2B:
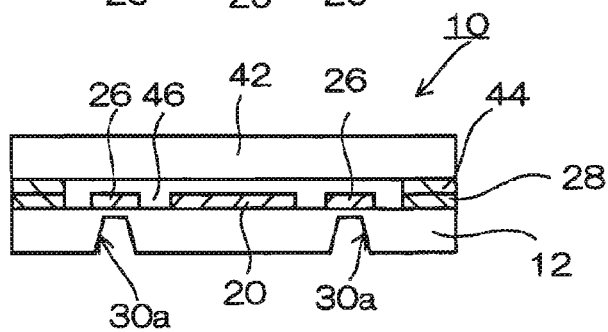
Figure 2C:
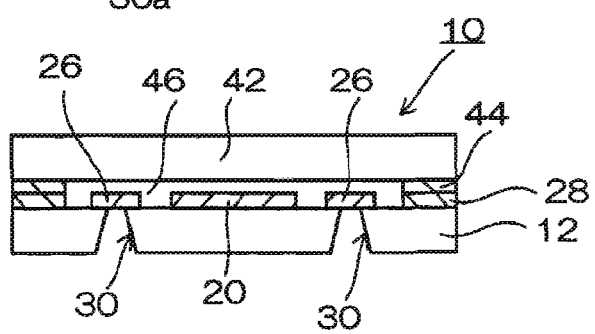
Figure 2D:
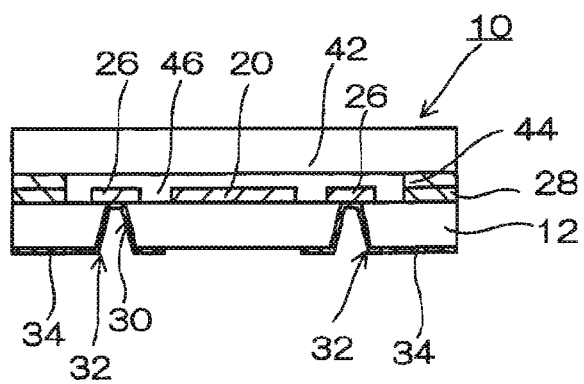
Figure 2E:
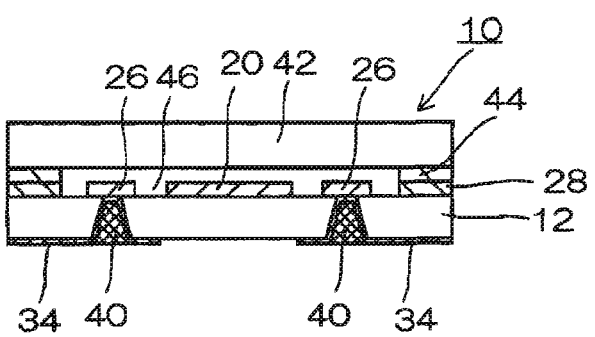

Explained hereinafter is a first embodiment of the piezoelectric device according to the invention, referring to FIG. 1 and exemplifying a SAW element. In FIG. 1, FIG. 1A is a plane view of the SAW element and FIG. 1B is a view taken along a line A-A of the same FIG. 1A. A SAW element 10 of the embodiment includes a piezoelectric substrate 12 and a covering body 42 which covers a first surface of the piezoelectric substrate 12. The piezoelectric substrate 12 is formed with an interdigital transducer (IDT) 20 which is formed such that a pair of comb-shaped electrodes 14, each being composed of bus bars 16 arranged along with a propagation direction of a surface acoustic wave and a plurality of electrode fingers 18 formed orthogonal to the bus bars 16, are placed in a interlocked manner, and a pair of reflectors 22 sandwiching the IDT 20 is placed in the propagation direction of surface acoustic wave. The reflectors 22 are formed into grid-like shapes in which the electrode fingers 18 composing the comb-shaped electrodes 14 and a plurality of conductive strips 24 arranged in parallel to each other are connected to one another. The comb-shaped electrodes 14 composing the IDT 20 is provided with leading electrodes 26 for inputting or outputting signals to the IDT 20. The IDT 20 formed on the piezoelectric substrate 12, the excitation electrodes such as the reflectors 22 and the leading electrodes 26 are composed of thin metal films made of aluminum (Al) or the like. Further, an edge portion of the piezoelectric substrate 12 according to the embodiment is formed with a metal pattern 28 serving as a bonding film and having a thickness equal to those of the IDT 20, the reflectors 22 and the leading electrodes 26. Examples of components of the metal pattern 28 are, for example, gold (Au) and aluminum (Al).

Examples of components of the piezoelectric substrate 12 include, crystal (SiO2), lithium tantalate ($LiTaO_3$), lithium niobate ($LiNbO_3$) and the like. In the first embodiment, a case where the piezoelectric substrate 12 is made of crystal is exemplified for the sake of explanation.

The piezoelectric substrate 12 includes through-holes 30 formed at positions where the leading electrodes 26 are formed from the second surface to the leading electrodes 26. The through-holes 30 are bored until exposing a part of the leading electrodes 26 to a hole forming section without penetrating the thin metal film which forms the leading electrodes 26. Further, metal films 32 are formed on the second surface of the piezoelectric substrate 12 and the through-holes 30 by vapor deposition, spattering, plating or the like. Thereby, mountable exterior electrodes 34 are formed on the second surface of the piezoelectric substrate 12 and conduction between the mountable exterior electrodes 34 and the leading electrodes 26 is established. The through-holes 30 provided with the metal films 32 for the sake of conduction accordingly are filled with conduction members such as soldering material 40 in order to enhance the conductivity.

In order to keep a good bonding condition, it is preferable to employ a member having the same thermal expansion coefficient as that of the piezoelectric substrate 12 for covering body 42 to cover the first surface of the piezoelectric substrate 12. In the embodiment, a case where the constituent of the covering body 42 is crystal as well as that of the piezoelectric substrate 12 is explained as an example. On the covering body 42, metal pattern 44 made of the same material and having the same shape as that of the metal pattern 28 are formed to be at a position corresponding to the position of the metal pattern 28 formed on the edge portion of the piezoelectric substrate 12. The piezoelectric substrate 12 and the covering body 42 having the above stated structure are bonded to each other through the metal patterns 28 and 44 as bonding films by thermocompression (metal bonding).

A manufacturing method of the SAW element 10 having the above stated structure is explained hereinafter, referring to FIG. 2. For the SAW element 10 according to the embodiment, firstly the piezoelectric substrate 12 having the IDT 20, the reflectors 22 and the leading electrodes 26 formed on the first surface thereof and the covering body 42 are bonded (See FIG. 2A.) Then, preliminary holes 30a are formed on the second surface of the piezoelectric substrate 12 by abrasive blasting to be at positions corresponding to the leading electrodes 26. The preliminary holes 30a can be formed to have a depth in which the thickness of the piezoelectric substrate is slightly left without penetrating through the piezoelectric substrate 12. In other words, the piezoelectric substrate 12 is bored in the halfway thereof. When the preliminary holes 30a are formed, it will be sufficient if one-tenth of the thickness of the piezoelectric substrate 12 is left (See FIG. 2B.) After the preliminary holes 30a are formed, the through-holes 30 are formed on the piezoelectric substrate 12 through dry etching. An example of the reaction gas to be used for dry etching includes Freon gas (tetrafluoromethane: $CF_4$) (See FIG. 2C.) After the through-holes 30 on the piezoelectric substrate 12 are formed, the metal films 32 are formed on the second surface of the piezoelectric substrate 12 and inside of the through-holes 30 through vapor deposition, spattering or plating. By performing photolithography to the metal films 32 formed, the mountable exterior electrodes 34 are formed on the second surface of the piezoelectric substrate 12 (See FIG. 2D.) Then, the positions where through-holes 30 are formed, in which concave portions are left, are filled with soldering material 40 in order to fill up the holes (See FIG. 2E.)

When abrasive blasting is performed in the forming method of the SAW element 10 as stated above, the whole surface of the SAW element 10 is firstly covered with a protection film (such as a resist film, not shown here) in order to protect the SAW element from $CF_4$ gas to be used to etch crystal by dry etching. A preferred coating method using the resist film is, for example, dip coating. In a case where only the second surface of the piezoelectric substrate 12 is covered, spin coating may be employed. As the resist, a photosensitive positive resist (or a negative type is possible) can be used. The resist is irradiated with ultraviolet light through a photo mask with an opening at the positions where the preliminary holes 30a are formed. After the irradiation of the ultraviolet light, the SAW element 10 is dipped into developing solution to remove the resist having applied onto the positions where the preliminary holes 30a are formed. After the resist at the photosensitive portion is removed, baking is performed in order to remove solution or the like used in developing.

After the resist film for the dry etching is formed through the photolithography as stated above, the resist film for abrasive blasting is formed. As the resist film for abrasive blasting, a photosensitive polyurethane resin or the like is typically used. The method to form the resist film is performed in the same manner as stated above. That is, a resist resin for abrasive blasting is applied onto the resist film for dry etching through spin coating or the like and then cured, followed by sensitizing the positions where the preliminary holes 30a are formed with the ultraviolet light using the photo mask and removing the resist film corresponding to the sensitized position by developing solution (e.g. alkalescent solution).

The resist film is formed in the above stated manner. By performing abrasive blasting to the second surface of the piezoelectric substrate 12 of which processed surface is partially exposed as the forming positions of the preliminary holes 30a, the preliminary holes 30a stated above can be formed.

When the dry etching is performed after formation of the preliminary holes 30a, the resist film for the abrasive blasting is firstly removed. Then, the SAW element 10 is loaded in a chamber for dry etching and etched by $CF_4$ gas so that the preliminary holes 30a penetrate through. When the through-holes 30 are formed in such a manner, the etching terminates when the piezoelectric substrate 12 is bored through since Al forming the leading electrodes 26 is hard to be etched by $CF_4$ gas. Therefore, the thin metal films composing the leading electrodes 26 cannot be bored through. In addition, the resist film forming method itself does not give any effect to the first embodiment according to the invention.

In the manufacturing method stated above, when the metal films 32 are formed on the through-holes 30 on the piezoelectric substrate 12 and the second surface of the piezoelectric substrate 12, vapor deposition, spattering and plating are cited as the forming method. However, since the metal films formed by vapor deposition or spattering are extremely thin, there is a possibility that the metal films are detached by solder to be used in mounting the piezoelectric substrate 12 on the other substrate or the like, which is generally referred to as a solder leach. Therefore, it is desired that the metal films 32 be formed by plating capable of forming a thicker film. However, as far as the metal films 32 are made thick, the metal films 32 can be formed by deposition or spattering. Further, the metal films 32 may be formed through vapor deposition or spattering in combination with plating.

In the SAW element 10 manufactured as stated above, the through-holes 30 are formed on the piezoelectric substrate 12 having the excitation electrode so as to establish conduction with the mountable exterior electrodes 34 through the through-holes 30. As a result, high conductivity is obtained. Further, since the through-holes 30 are formed so as to penetrate through the piezoelectric substrate 12 only after the piezoelectric substrate 12 is bonded with the covering body 42, an excitation space 46 is not open to the outside after bonding. As a result, the excitation space 46 of the SAW element 10 can secure high air tightness. Further, because the through-holes 30 are formed after the piezoelectric substrate 12 is bonded with the covering body 42, there is no risk that cleaning liquid or foreign matters remain in the through-holes in the course of cleaning each member. Still further, when the piezoelectric substrate 12 and the covering body 42 are bonded by thermocompression, pressuring force cannot be concentrated on a small area since the surfaces to be pressed for both of the piezoelectric substrate 12 and the covering body 42 are flat. Therefore, a possibility that the pressuring force causes a breakage or a damage of the piezoelectric substrate 12 and the covering body 42 is small.

Figure 3:
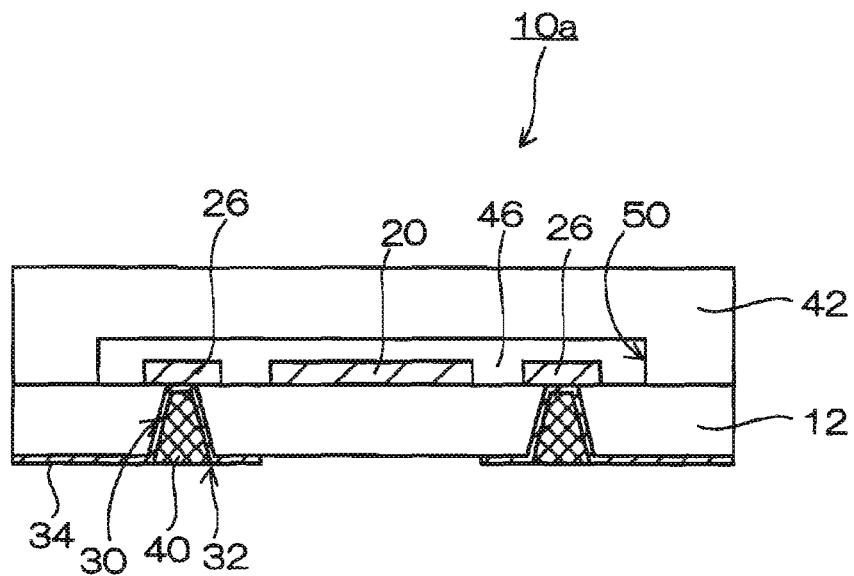
FIG. 3 illustrates a second embodiment of the piezoelectric device according to the invention.

A second embodiment of the piezoelectric device according to the invention is explained next, referring to FIG. 3. A basic structure of the piezoelectric device according to the second embodiment is similar to that of the piezoelectric device, i.e., the SAW element, according to the first embodiment stated above. Accordingly, components having the same functions as those in the first embodiment will be given the same symbols in drawings and omitted of detailed explanations thereof.

A SAW element 10a according to the second embodiment is featured in that the bonding method between the piezoelectric substrate 12 and the covering body 42 is different from that of the SAW element 10 according to the first embodiment. More specifically, the SAW element 10a according to the second embodiment employs a direct bonding without using bonding films between bonding surfaces as a method to bond the piezoelectric substrate 12 and the covering body 42.

The direct bonding is a method to bond the piezoelectric substrate 12 and the covering body 42 which are made of the same material such as crystal without using the metal patterns 28 and 44, (See FIG. 1) serving as the bonding films as stated above. The procedure for bonding is as follows. Firstly the bonding surfaces of the piezoelectric substrate 12 and the covering body 42 are cleaned after mirror polishing, and water ($H_2O$) is interposed between the bonding surfaces of the piezoelectric substrate 12 and the covering body 42 by hydrophilic processing. The hydrophilic processing is a processing, for example, in which the bonding surfaces are slightly oxidized, in order to enhance hydrophilicity. Further, water between the bonding surfaces contribute to an attachment of hydroxyle group (OH) to the bonding surfaces. Then, the piezoelectric substrate 12 and the covering body 42 are pressed each other for provisional bonding. After the provisional bonding, the piezoelectric substrate 12 and the covering body 42 are pressed each other further while the piezoelectric substrate 12 and the covering body 42 are heated to allow water interposed between the bonding surfaces to evaporate to cause a siloxane bond (Si—O—Si) between the bonding surfaces, thereby completing the bonding. In the meantime, application of supersonic waves to the pressed surfaces upon heating and pressing enables to accelerate the reaction, resulting in a completion of the bonding therebetween within a short time period.

In the direct bonding state above, since connectors of the atoms positioned between the bonding surfaces directly bond to each other, an enhanced bonding with high air tightness can be realized. Further, since no bonding films are required, a step to form bonding films can be omitted.

Figure 4:
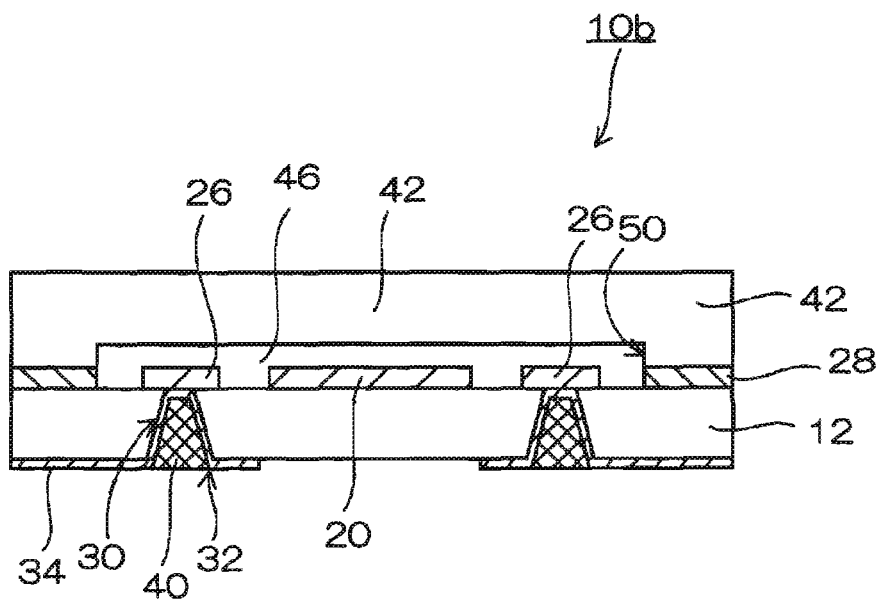
FIG. 4 illustrates a third embodiment of the piezoelectric device according to the invention.

A third embodiment of the piezoelectric device according to the invention is explained next, referring to FIG. 4. A basic structure of the piezoelectric device according to the third embodiment is similar to those of the piezoelectric devices, i.e., the SAW elements, according to the first and the second embodiments stated above. Consequently, components having the same functions as those in the first and second embodiments will be given the same symbols in the attached drawings and the detailed explanations thereof will be omitted.

A SAW element 10b according to the third embodiment is featured in that, alike the SAW element 10a stated in the second embodiment, a bonding method between the piezoelectric substrate 12 and the covering body 42 differs from that of the SAW element 10 according to the first embodiment. More specifically, the SAW element 10b according to the third embodiment is featured in employing anodic bonding as a method to bond the piezoelectric substrate 12 and the covering body 42.

The anodic bonding is a kind of direct bonding. However, unlike the above stated direct bonding, the anodic bonding is a method enabling a direct bonding not only between the crystal surfaces but also between a crystal surface and a glass surface or between metal surfaces and so on by generating a Si—O covalent bonding without requiring bonding films therebetween. In other words, although FIG. 4 shows that the metal pattern 28 formed on the piezoelectric substrate as a bonding section and the covering body 42 are to be bonded, it is also possible to bond the piezoelectric substrate 12 with the covering body 42 without interposing the metal pattern 28 therebetween. More specifically, the piezoelectric substrate 12 and the covering body 42 are placed at a temperature of around several hundreds degrees centigrade and subsequently a direct current of a voltage of several hundreds voltages are applied thereto so as to generate the covalent bonding between the piezoelectric substrate 12 and the covering body 42. In a case where the covering body 42 is made of crystal as the case of the third embodiment, to be specific, the covering body 42 can serve as an anode while the metal pattern 28 serve as a cathode to apply the current. A feature in performing the anodic bonding is that a physical deformation which may cause to the piezoelectric substrate 12 or the covering body 42 can be minimized remarkably. Further, when the anodic bonding is performed, bonded members can also be separated without being damaged by reverse current application. Further, since the anodic bonding enables an enhanced bonding as well as the direct bonding stated above, the excitation space 46 can secure high airtightness.

Further, when the bonding between the piezoelectric substrate 12 and the covering body 42 is performed by the direct bonding or anodic bonding stated above, there is a possibility to make it difficult to secure the excitation space 46 if an opposing surface of the covering body 42 is made to be a plain surface. Therefore, it is preferable that a concave portion 50 be formed at a position opposing to the excitation electrode of the covering body 42 in order to secure the excitation space 46 sufficiently upon bonding the piezoelectric substrate 12 with the covering body 42.

In each of the embodiment stated above, the case where a member composing the covering body 42 is made of crystal that is the same as the piezoelectric substrate 12 is explained. However, the member composing the covering body 42 may be any members such as metal or the others, as far as they have a coefficient of thermal expansion close to that of the piezoelectric substrate 12 and can keep airtightness in the excitation space 46 after the bonding. However, if the covering body 42 is composed of conductive members, a thickness of the thin metal films needs to be defined so as to prevent electrodes such as leading electrodes 26 from coming in contact with the covering body 42.

A fourth embodiment of the piezoelectric device according to the invention is explained next, referring to FIG. 5.

A basic structure of the piezoelectric device according to the fourth embodiment is similar to that of the piezoelectric devices, i.e., the SAW elements, according to the first, second and third embodiments as stated above. Therefore, components having the same functions will be provided with the same symbols and omitted for their explanations.

Figure 5:
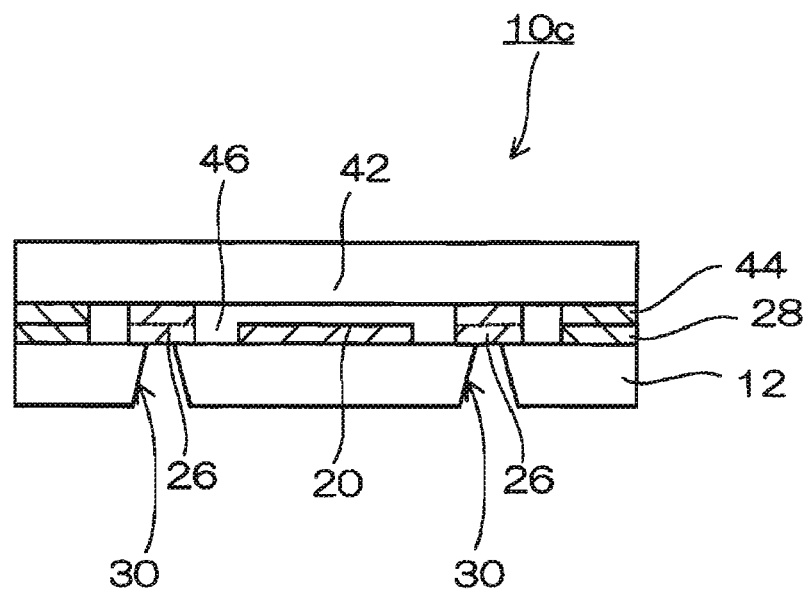
FIG. 5 illustrates a fourth embodiment of the piezoelectric device according to the invention.

The SAW element 10c according to the fourth embodiment is featured in that a thickness of the thin metal films composing the leading electrodes 26 is, as illustrated in FIG. 5, made to be thicker than that of the thin metal films composing the IDT 20 or the reflectors 22, see FIG. 1. More specifically, in the fourth embodiment, the thickness of the thin metal films composing the leading electrodes 26 is made to be equal to a height of the excitation space 46 to allow the leading electrodes 26 to contact the covering body 42. With such a structure, in the case where the excitation space 46 after bonding the piezoelectric substrate 12 with the covering body 42 can keep high airtightness such as vacuity, the thin metal films composing the leading electrodes 26 are not broken due to an adverse effect of air pressure upon forming the through-holes 30.

Figure 6:
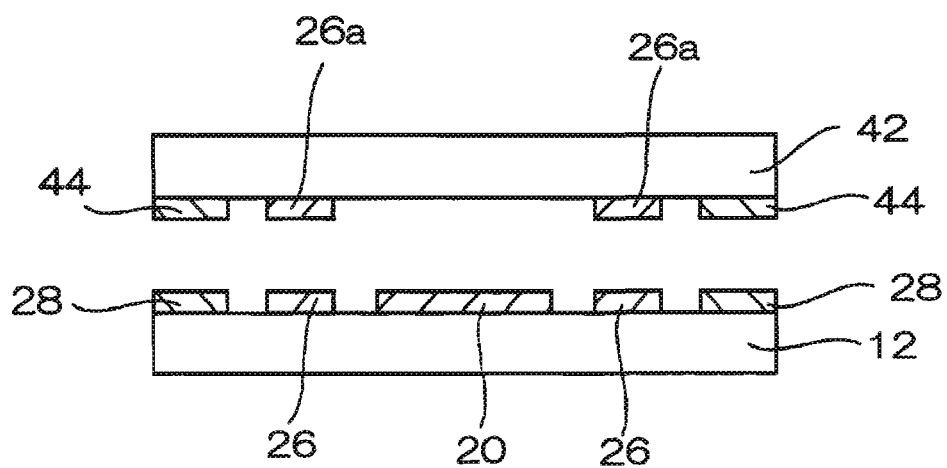
FIG. 6 schematically illustrates a manufacturing method of the piezoelectric device according to the fourth embodiment of the invention.
Figure 7:
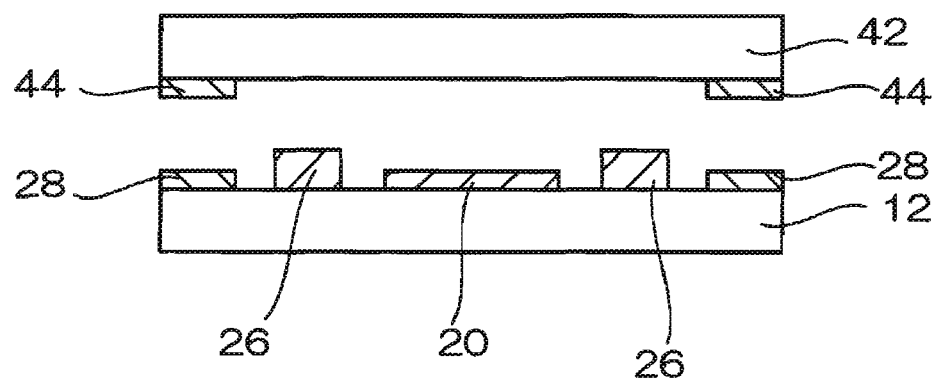
FIG. 7 schematically illustrates another embodiment of the manufacturing method of the piezoelectric device according to the fourth embodiment of the invention.

Accordingly, when the leading electrodes 26 are made thicker, methods illustrated in FIG. 6 or FIG. 7 can be employed. According to the method illustrated in FIG. 6, the IDT 20, the reflectors 22, the leading electrodes 26, and the metal pattern 28 are formed into the same thickness to be formed on the first surface of the piezoelectric substrate 12, and thin metal films 26a having the same thickness as the metal pattern 44 to be formed on the covering body 42 are formed at positions opposing to the leading electrodes 26 of the piezoelectric substrate 12. By bonding the piezoelectric substrate 12 and the covering body 42 that are formed in this manner, the SAW element 10c in which the thickness of the thin metal films composing the leading electrodes 26 equals to the height of the excitation space 46 can be formed. With such a method that the thickness of the leading electrodes 26 can be made thicker, the thin metal films 26a at a side of the covering body 42 can be formed in the same manufacturing step in which the metal pattern 28 is formed on the edge portion of the piezoelectric substrate. As such, the leading electrodes 26 can be made thicker without additional manufacturing steps. Since a purpose of making the leading electrodes 26 thicker is to prevent the breakage of the thin metal films composing the leading electrodes 26 due to the adverse effect of the air pressure between the excitation space and the outside upon forming the through-holes 30 on the piezoelectric substrate 12, it is not necessary to seek for a bonding strength or the like between the films.

According to a method illustrated in FIG. 7, the thickness per se of the leading electrodes 26 for the IDT 20 formed on the piezoelectric substrate 12 is made thicker. With this method, the number of manufacturing steps will be increased in order to make the leading electrodes 26 thicker. However, there is an advantage that the thickness of the leading electrodes can be determined as required. Since the shape or the structure of the leading electrodes 26 does not directly affect on a frequency characteristic of the SAW element 10c, it is also possible to enhance a strength of the leading electrodes 26 by coating the leading electrodes 26 with something other than the metal films. According to the method, alike the method illustrated in FIG. 6, it is possible to prevent the adverse effect which causes the breakage of the thin metal films composing the leading electrodes 26 due to the air pressure between the excitation space 46 and the outside upon forming the through-holes 30 onto the piezoelectric substrate 12.

According to the embodiments stated above, the piezoelectric devices, such as SAW elements 10 and 10a to 10c, manufacturing methods have been explained one by one. The piezoelectric device manufacturing method according to the invention and the through-hole forming method for a piezoelectric substrate are also applicable to a manufacturing step performed wafer by wafer. Further, according to the above stated embodiments, the IDT 20 and the leading electrodes 26 are explained separately; however, for example, the bus bars 16 composing the IDT 20 may be used as the leading electrodes.

In the embodiments stated above, the SAW element is exemplified as the piezoelectric device. Examples of the device including the piezoelectric element which is manufactured by the through-hole forming method for a piezoelectric substrate according to the invention include the SAW element stated above, or an oscillator or various sensors in which the SAW element provided with an electronic member such as IC or the like in addition to a SAW resonator and a SAW filter which employ the SAW element as it is. Examples of the SAW element or the sensor using the SAW element include a mass sensor, a diaphragm sensor or the like.

Figure 8:
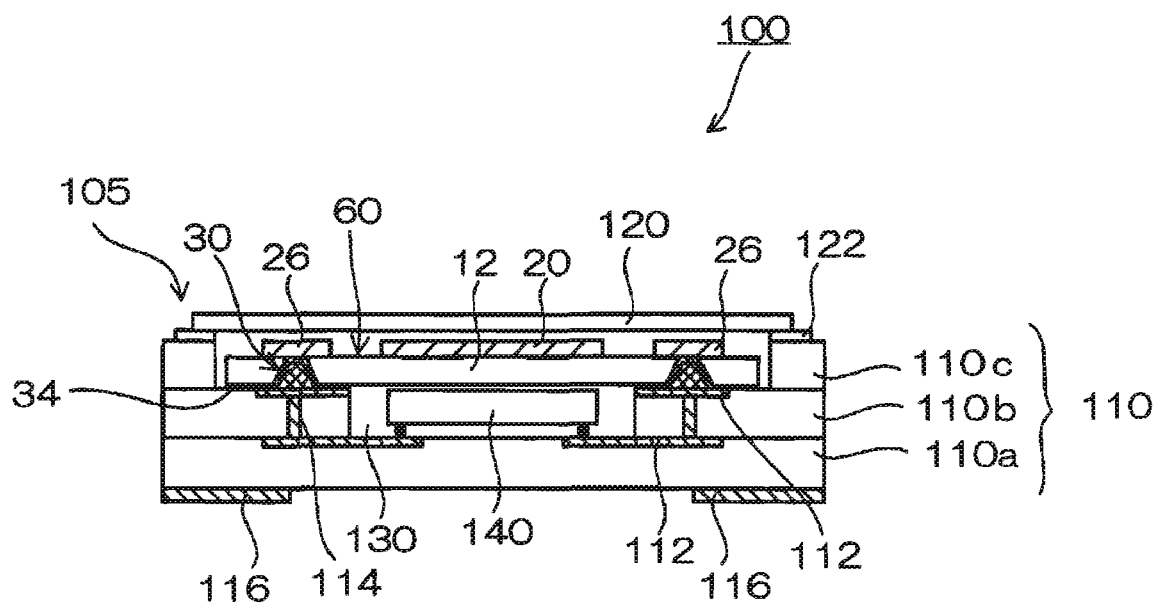
FIG. 8 illustrates an example of the piezoelectric device provided with the piezoelectric element manufactured by the through-hole forming method for a piezoelectric substrate according to the invention.
Figure 9:
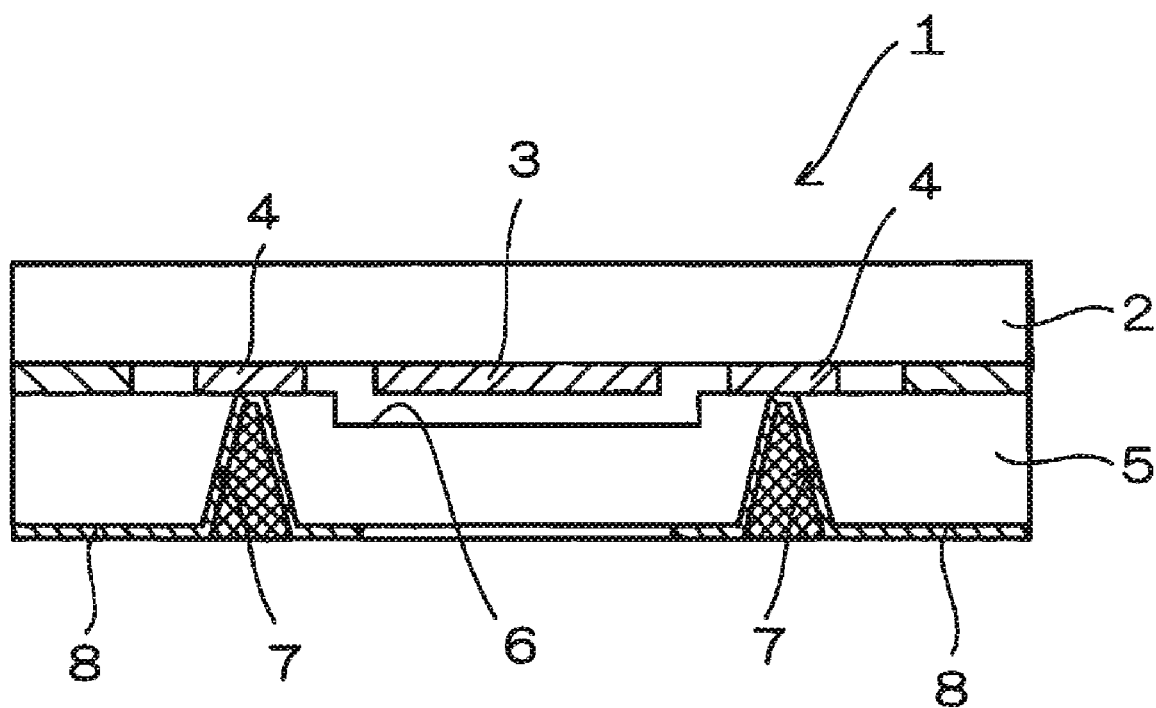
FIG. 9 illustrates an example of a SAW element having CSP structure.

When manufacturing the oscillator using the SAW element manufactured by the through-hole forming method for the above piezoelectric substrate, a structure, for example, as illustrated in FIG. 8 can be employed. An oscillator 100 illustrated in FIG. 8 includes an inner cavity 130 formed stepwise, a package 105 formed by a combination of a box-shaped base 110 with an opening facing upward and a covering body, that is a lid 120, for sealing the opening of the base 110, a SAW element 60 to be mounted in the package 105, and an IC 140. The base 110 is so formed that a plurality of substrates 110a to 110c are layered one another, each of the substrates 110a to 110c being formed with wiring patterns 112 made of the thin metal films and the wiring patterns 112 formed on each of the substrates 110a to 110c being electrically connected via through-holes 114 or the like as required for the sake of establishing conductivity. Formed on a lower surface of the base 110 is an exterior mounting electrodes 116 to be electrically connected with the wiring patterns 112 formed in the package. The IC 140 is mounted by, for example, flip chip bonding on each of the wiring patterns 112 formed on the substrate 110a in a condition that an active surface thereof faces down with regard to the base 110 having the above stated structure. The SAW element 60 is mounted on the wiring patterns 112 formed on the substrate 11b in a condition an active surface thereof faces up. The oscillator 100 formed in the above stated manner contributes to a low profile of the package 105 because no wire is required for internal wiring. Also, since the active surface of the SAW element 60 can be placed toward the opening of the base 110, if the lid 120 is made of a translucent material such as glass, the thin metal films are scraped off by irradiating laser to the excitation electrodes after sealing the package 105 and resonance frequency of the oscillator 100 can be adjusted so as to set the resonance frequency of the oscillator 100 to a targeted value. It is preferable to employ seam welding or the like through a sealing ring 122 in bonding the lid 120 with the base 110.

In the embodiment stated above, the substrate for the SAW element has been explained as the piezoelectric substrate for forming the through-holes. However, the through-hole forming method for a piezoelectric substrate according to the invention can also be employed in manufacturing an AT cut type piezoelectric resonator element or a tuning fork type piezoelectric resonator element, or a gyro element.

What is claimed is:

1. A method of forming a through-hole for a piezoelectric substrate having an excitation electrode and a leading electrode which are formed on a first surface of the piezoelectric substrate and are made of a thin metal film in order to establish conductivity, the method comprising:
   blasting a position on a second surface of the piezoelectric substrate opposite the first surface corresponding to the leading electrode to form a preliminary hole by boring the piezoelectric substrate to a depth in which a thickness of the piezoelectric substrate is left in a bottom of the preliminary hole without completely penetrating the piezoelectric substrate;
   etching a bottom of the preliminary hole to form a through-hole through which a part of the leading electrode is exposed; and
   placing a conductive material in the through-hole, the conductive material contacting the leading electrode from the second surface of the piezoelectric substrate.

2. A method of manufacturing a piezoelectric device having a piezoelectric substrate including an excitation electrode and a leading electrode which are formed on a first surface of the piezoelectric substrate and made of a thin metal film and a covering body for covering an electrode forming surface of the piezoelectric substrate, the method comprising:
   bonding the piezoelectric substrate with the covering body;
   blasting a position on a second surface of the piezoelectric substrate opposite the first surface corresponding to the leading electrode to form a preliminary hole by boring the piezoelectric substrate a depth in which a thickness of the piezoelectric substrate is left in a bottom of the preliminary hole without completely penetrating the piezoelectric substrate:
   etching a bottom of the preliminary hole to form a through-hole through which a part of the leading electrode is exposed; and
   placing a conductive material in the through-hole, the conductive material contacting the leading electrode from the second surface of the piezoelectric substrate.

3. The method of manufacturing a piezoelectric device according to claim 2, wherein the leading electrode is thicker than metal films of the excitation electrode.

4. The method of manufacturing a piezoelectric device according to claim 2, wherein the piezoelectric substrate is made of crystal, the thin metal film is made of aluminum and the etching employs a dry etching method in which $CF_4$ gas is used as a reaction gas.

* * * * *